United States Patent
Schindler et al.

(10) Patent No.: US 6,197,633 B1
(45) Date of Patent: Mar. 6, 2001

(54) METHOD FOR THE PRODUCTION OF AN INTEGRATED SEMICONDUCTOR MEMORY CONFIGURATION

(75) Inventors: Günther Schindler; Walter Hartner, both of Munich; Carlos Mazure-Espejo, Zorneding, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,822

(22) Filed: Mar. 30, 1999

Related U.S. Application Data

(63) Continuation of application No. PCT/DE97/01965, filed on Sep. 5, 1997.

(30) Foreign Application Priority Data

Sep. 30, 1996 (DE) .............................................. 196 40 271

(51) Int. Cl.[7] .............................................. H01L 21/8242
(52) U.S. Cl. .............................................. 438/253; 438/254
(58) Field of Search .................................... 438/238–240, 438/243–250, 253–256, 381, 386–399

(56) References Cited

U.S. PATENT DOCUMENTS

| | | |
|---|---|---|
| 5,290,726 | 3/1994 | Kim . |
| 5,744,833 * | 4/1998 | Chao .................................... 257/308 |
| 5,973,349 * | 10/1999 | Ikemasu ................................ 257/308 |

FOREIGN PATENT DOCUMENTS

| | | |
|---|---|---|
| 0 415 530 A1 | 3/1991 | (EP) . |
| 0 657 935 A2 | 6/1995 | (EP) . |
| 2 245 761 | 1/1992 | (GB) . |
| 62-179759 | 8/1987 | (JP) . |

OTHER PUBLICATIONS

Patent Abstracts of Japan No. 03-153074 (Akio), dated Jul. 1, 1991.

"Components of Semiconductor Electronics", 4th edition, 1991, pp. 256–257.

* cited by examiner

*Primary Examiner*—Jey Tsai
(74) *Attorney, Agent, or Firm*—Herbert L. Lerner; Laurence A. Greenberg; Werner H. Stemer

(57) ABSTRACT

A method for producing a memory configuration that comprises a multiplicity of memory cells, and has storage capacitors whose first electrodes are configured in plate form in a parallel manner one above the other. These electrodes are in electrical contact with selection transistors of the memory cell through contact plugs having different lengths. The first electrodes preferably extend beyond the cell area of one memory cell.

3 Claims, 3 Drawing Sheets

METHOD FOR THE PRODUCTION OF AN INTEGRATED SEMICONDUCTOR MEMORY CONFIGURATION

CROSS-REFERENCE TO RELATED APPLICATION

This is a continuation of copending International Application PCT/DE97/01965, filed Sep. 5, 1997, which designated the United States.

BACKGROUND OF THE INVENTION

Field of the Invention

The invention relates in general to the field of semiconductors, and specifically to a method for ensuring that the capacitance of a storage capacitor does not decrease when the integration level is increased, and even more specifically to a method for producing a memory cell with a storage capacitor having an electrode surface area that is greater than the surface area of the individual memory cell.

A memory cell having a storage capacitor with an electrode designed virtually as a planar plate and being configured parallel to a main surface area of the memory configuration is disclosed in Müller, "Bauelemente der Halbleiterelektronik", [Components of semiconductor electronics], Springer, 4th edition, 1991, 256 ff. The capacitance of a storage capacitor is a function of the capacitor area and would ordinarily become smaller with an increased integration level and the associated reduction in size of the memory configuration. To address this problem, the above-mentioned document proposes the design of a storage capacitor as a trench capacitor that is configured like a pot in a main area of a memory configuration. The latter discussed design for realizing a storage capacitor has a considerably greater outlay than the former discussed design for a storage capacitor.

A further possibility for maintaining a specific capacitor area with an increased integration level is shown in U.S. Pat. No. 5,290,726. This document describes a design of the storage capacitor as a fin stacked capacitor which is configured over the selection transistor of the memory cell. In this design, a first electrode of the storage capacitor has a cross-section with a plurality of fingers lying next to one another and above one another, in order to increase the electrode surface area and hence the capacitor area in comparison with a plate-like design of the first electrode. This design of the storage capacitor requires a certain minimum area above the selection transistor within which the capacitor can be formed. As the integration level increases, it is difficult to provide this minimum area which is necessary for forming the capacitor. Furthermore, the capacitor structure described requires a very complicated production method.

European Patent Application EP 06 57 935 A2 discloses a semiconductor memory configuration and a method for the production of the semiconductor memory configuration. The memory configuration includes storage capacitors that have first electrodes designed as electrode plates that are configured at a distance one above the other as well as parallel to an upper main surface area of the semiconductor memory configuration. Each respective electrode plate is electrically connected to a respective selection transistor of a memory cell by a contact plug. In accordance with FIG. 3B of that document, the individual contact plugs are designed with different lengths corresponding to the distance to the respective electrode plate.

Japanese Patent Application JP 03-153074 A and Japanese Patent Application JP 62-179759 A describe semiconductor memory configurations having storage capacitors which have electrodes in plate form.

SUMMARY OF THE INVENTION

It is accordingly an object of the present invention to provide a method for the production of an integrated semiconductor memory configuration that provides a sufficiently large capacitor area and/or a sufficiently large value of capacitance in a simple manner when the integration level is increased.

With the foregoing and other objects in view there is provided, in accordance with the invention, a method for producing an integrated semiconductor memory configuration having storage capacitors, which comprises:

providing a semiconductor body having a main surface with contacts and a memory configuration with a plurality of memory cells, each one of the memory cells having a selection transistor electrically connected to a respective one of the contacts;

depositing a plurality of alternating layers of an insulating material and an electrode plate onto the semiconductor body, the alternating layers disposed one above the other;

providing each one of the electrode plates with a lug projecting in a direction of a respective one of the contacts;

etching holes extending through the plurality of alternating layers of an insulating material and an electrode plate;

etching a plurality of holes through the plurality of alternating layers down to the main surface of the semiconductor body, each respective one of the holes being etched over a respective one of the contacts;

forming a plurality of contact plugs by filling the plurality of holes with conductive material, each contact plug being formed to electrically connect the lug of a respective electrode plate to a respective one of the contacts, and each of the contact plugs being formed with an upper end;

depositing an insulating layer on the upper ends of the plurality of contact plugs;

etching a trench extending through the plurality of alternating layers and being substantially perpendicular to the main surface of the semiconductor body;

isotropically etching away part of the insulating material of the plurality of alternating layers while leaving the plurality of contact plugs surrounded by the insulating material and allowing the electrode plates to project into the trench;

conformally depositing a dielectric layer on the electrode plates; and filling the trench with at least one electrically conductive material to form a second electrode.

In accordance with an added feature of the invention, a material selected from the group consisting of noble metals and oxides is provided on sides of each electrode plate that face the dielectric layer; and a material selected from the group consisting of a high-ε material and a ferroelectric material is provided as the dielectric layer.

In accordance with a concomitant feature of the invention, before the trench filling step is performed, a thin layer of a material selected from the group consisting of noble metals and oxides is conformally deposited over the dielectric layer.

In this production method, first all of the electrode layers and the insulating layers therebetween are deposited. Then, the holes for the contact plugs are etched over the respective contacts and filled with conductive material. In this case, all of the contact plugs would have the same length and would be laterally electrically connected to protruding lugs of the electrode plates. Only one respective contact plug makes electrical contact with one respective electrode plate. This is possible because the lugs on the different electrode plates are laterally offset with respect to one another. In order to avoid a short circuit with the counter-electrode, in other words the second electrode, of the storage capacitors, another insulating layer must be deposited on the upper ends of the contact plugs in order to cover the ends of the contact plugs.

The invention provides a simplified process as compared to the prior art because etching of all of the contact holes can be performed at the same time, thereby requiring only one etching step for all of the contact holes.

In a further inventive feature of the method, a high-$\epsilon$ material or a ferroelectric material can be used as the dielectric layer. The electrodes, at least on their sides facing the dielectric, must have a noble metal, for example Pt, Ru, Ir, Pd, or oxides such as, for example $IrO_2$, $RuO_2$, LaSrCoOx or the like, or must consist completely of these materials. To form the counter-electrode, it is appropriate to first deposit one of the abovementioned materials conformally as a thin layer over the dielectric and then to fill the remaining trench with a further, electrically conductive material, for example polysilicon.

In the integrated semiconductor configuration produced in this way, the first electrodes of a group of memory cells are each designed as electrode plates and are located at a distance one above the other as well as parallel to a main surface area of the semiconductor memory configuration. Furthermore, each of these first electrode plates is electrically connected to the selection transistor of a memory cell of the group by a contact plug. The individual contact plugs of a group of memory cells are designed with different lengths corresponding to the distance from the respective electrode plate.

The electrode plates are consequently configured at a distance one above the other like a sandwich. Each of these electrode plates are separately electrically connected through a contact plug to the selection transistor of a memory cell. The sandwich-like configuration of the electrode plates enables the electrode plates to project over cell areas of adjacent memory cells on the semiconductor body, thereby achieving the required large electrode area and hence increased capacitance of the storage capacitors.

The contact plugs are in electrical contact with a respective source region of a selection transistor of a memory cell, and the contact plugs extend essentially orthogonally with respect to the planes of the electrode plates.

Although the electrode plate can extend to a single cell area of an adjacent memory cell, it is appropriate, in order to further increase the capacitance of the storage capacitors, to design the electrode plates to project into a plurality of cell areas.

A group of n memory cells that are configured above one another or next to one another are provided. Each memory cell is in electrical contact through one of n contact plugs with one of n electrode plates lying one above the other, where n is a natural number greater than 2, for example n=4. Since the number of memory cells in a memory array of an integrated semiconductor memory configuration is regularly a power of 2, it is expedient to choose $n=2^m$, where m is a natural integer, in other words 1, 2, 3, 4, etc.

Furthermore, the electrode plates preferably extend in one direction from the contact plugs and both are surrounded by an insulating layer.

Another embodiment of the memory configuration produced according to the invention provides for first electrodes of one group of memory cells to face the first electrodes of another group of memory cells. Respective electrode plates, lying one above the other, of one group of memory cells are configured to face, a predetermined distance away from, respective electrode plates, lying one above the other, of another group of memory cells. In this embodiment, a counter-electrode serving as a second electrode can be configured between the opposite electrode plates of the two groups of memory cells. A dielectric layer is configured between the counter-electrode and the electrode plates forming the respective first electrode of a memory cell.

The essential advantage of the integrated semiconductor memory configuration produced in this way is that the storage capacitor is not restricted to the base area of one memory cell. Rather, the storage capacitors of a plurality of memory cells are combined and configured one above the other. Given n combined memory cells, a base area of n*cell area is thus available for each storage capacitor and its electrical supply line.

Other features which are considered as characteristic for the invention are set forth in the appended claims.

Although the invention is illustrated and described herein as embodied in a method for the production of an integrated semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
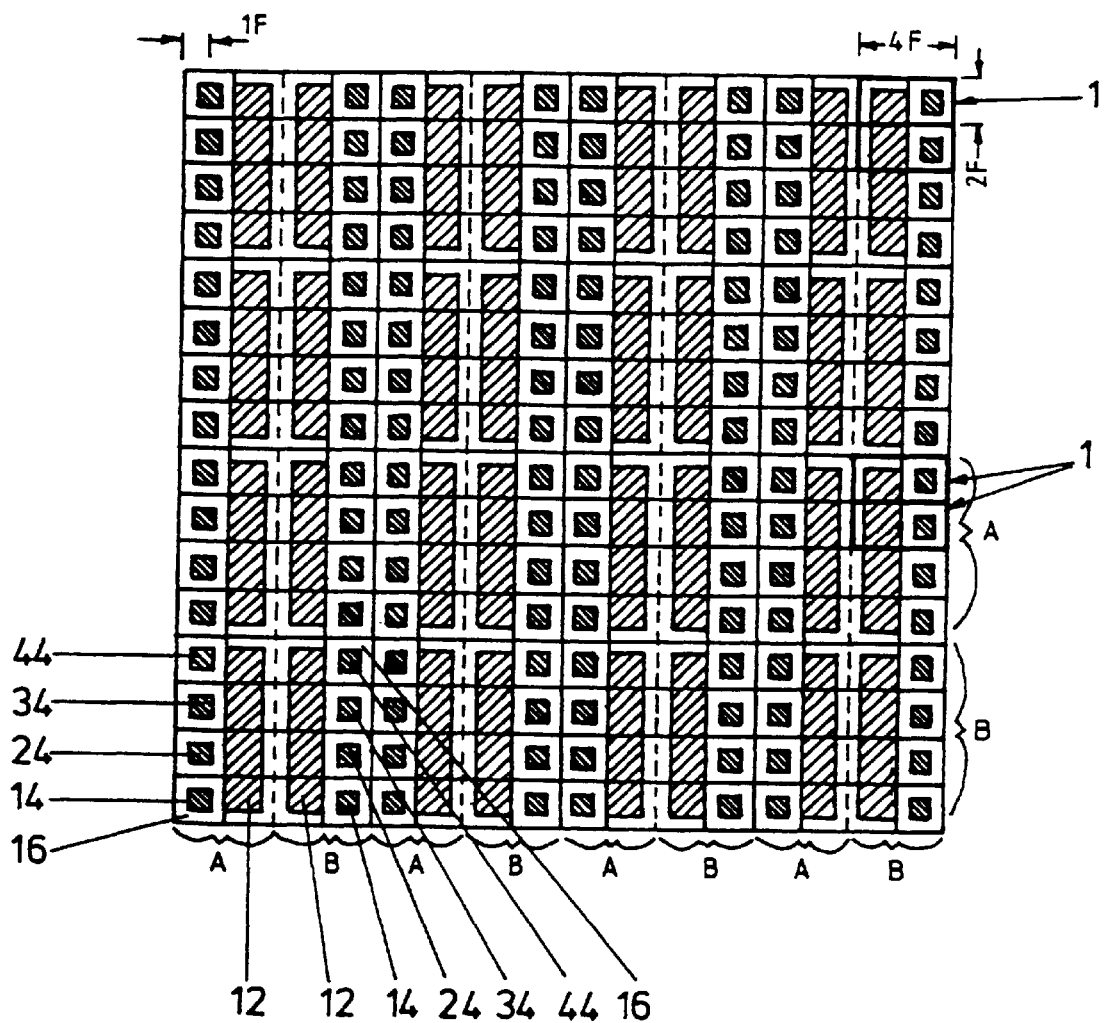
FIG. 1 is a plan view of a layout for an integrated semiconductor memory configuration with a memory array in which electrode plates of storage capacitors of one memory cell project into adjacent memory cell areas.

Unless indicated otherwise, identical reference symbols designate identical parts in the figures. FIG. 1 illustrates an exemplary embodiment of an integrated semiconductor memory configuration produced by the production method according to the invention. FIG. 1 shows a plan view of a memory array having a multiplicity, in this case 128, of similarly constructed memory cells 1. In the memory array illustrated, each memory cell 1 has a cell area with a width of 4F and a cell height of 2F, with the result that the total cell area of a single memory cell is $8F^2$. As illustrated, the individual memory cells are combined into groups A, B, with each group having four memory cells 1. The memory array illustrated has a total of 16 identical group pairs containing groups A and B. F denotes the so-called feature size. This is the width of the smallest structure that can be produced in an integrated circuit. F depends on the technology used and is usually determined by the resolution of the photolithography process. F is thus a unit of length that is characteristic of the technology used for the production of integrated circuits.

In the case of the illustrated exemplary embodiment of FIG. 1, contact plugs 14, 24, 34 and 44 are configured in the left-hand half of the cell area in the memory cells 1 of each group A, and contact plugs 14, 24, 34 and 44 are configured in the right-hand half of the cell area in the memory cells 1 of each group B. These contact plugs 14, 24, 34, 44 extend from the main surface area of the semiconductor body of the integrated memory configuration to make electrical contact with a respective electrode plate that forms a first electrode of a storage capacitor of a memory cell 1. The contact plugs 14, 24, 34 and 44 are surrounded by an insulating layer 16, except for the electrical connection to a respective electrode plate. As shown in FIG. 1, the insulating layer 16 is in the half of the cell area of a memory cell that is already occupied by a contact plug 14, 24, 34 and 44.

FIG. 1 illustrates first electrode plates 12, which are electrically connected to the contact plugs 14 of each of the groups of memory cells 1, for example. Each of these electrode plates 12 extends into the unoccupied halves of the cell areas of those memory cells 1 which belong to a group A or B. However, the electrode plates 12 project to a point not quite as far as the outer edge of the adjacent cell areas. As a result a gap 9 remains between the individual electrode plates 12 of the groups A and B of memory cells 1, as shown in FIG. 1. The gap is necessary for the interposition of a dielectric layer and a counter-electrode, as will be explained with reference to FIG. 4.

In the exemplary embodiment of FIG. 1, the electrode plates 12 have an area of $31F^2$ if it is assumed that one electrode plate has a thickness of 1F. This value, can of course, be increased if even more memory cells 1 are combined to form a group A or B. The electrode plates 12 will then extend into corresponding cell areas of more memory cells 1. However, this will then additionally require correspondingly more electrode plates lying one above the other.

Figure 2A:
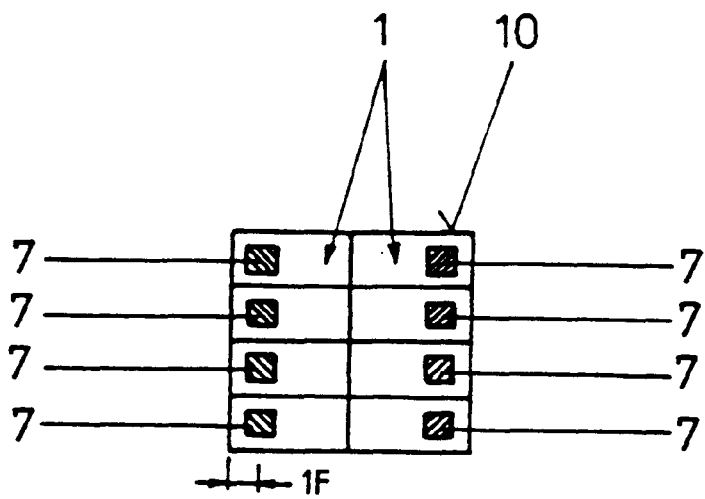
FIG. 2a is a sectional view of two groups of memory cells taken through one electrode plate.

For further illustration, five different sectional views taken through the memory array shown in FIG. 1 are illustrated in FIGS. 2a, 2b, 2c, 2d and 2e. The individual sections are taken parallel to the main surface area of the memory configuration for two opposite groups A and B of memory cells 1. The rectangular cell area is designated by 10. In FIG. 2a, the section is taken at the level of contacts 7 seated on the upper main surface area of a semiconductor body having embedded selection transistors. The contacts 7 are each electrically connected to a source region of such a selection transistor.

Figure 2B:
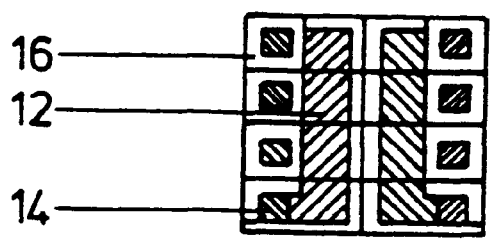
FIG. 2b is a sectional view of two groups of memory cells taken through another electrode plate.

FIG. 2b shows a sectional view at the level of a first electrode plate 12, as has already been explained in FIG. 1. However, FIG. 2b clearly shows the electrical connection of the contact plugs 14 to the electrode plates 12. Each electrode plate 12 is designed in a L-shaped manner to enable an electrical connection to a respective contact plug 14. The remaining contact plugs 24, 34 and 44 can likewise be discerned, since these are designed to be longer than the contact plugs 14. The reference symbol 16 again represents the insulating layer surrounding the contact plugs 14, 24, 34 and 44.

Figure 2C:
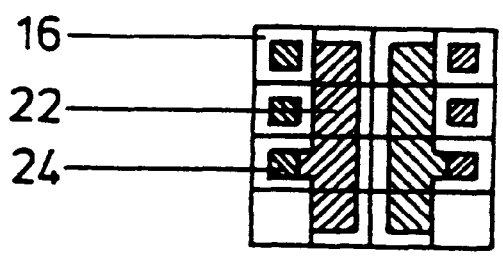
FIG. 2c is a sectional view of two groups of memory cells taken through another electrode plate.
Figure 2D:
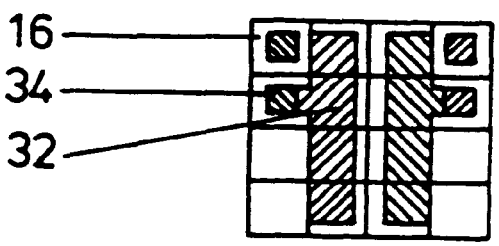
FIGS. 2d–2e are a sectional view of two groups of memory cells taken through another electrode plate.
Figure 2E:
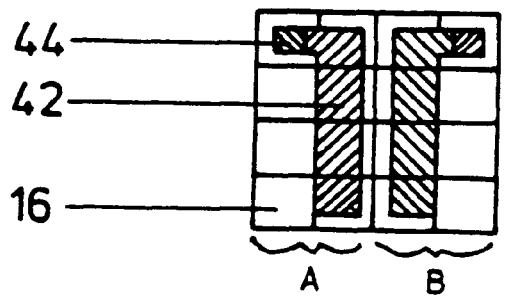

FIGS. 2c, 2d and 2e respectively illustrate sectional views at the level of electrode plates 22, 32 and 42. The electrode plates 22, 32, and 42 likewise protrude like lugs in the direction of the respective contact plugs 24, 34 and 44 and are in electrical contact with the latter. The individual sectional views clearly reveal that the contact plug 44 is the longest, in order to make contact with the electrode plate 42 that is furthest away from the contacts. The contact plugs 14, 24, 34 and 44 connect each of the contacts 7 shown in FIG. 2a to exactly one of the electrode plates 12, 22, 32 and 42.

Figure 3:
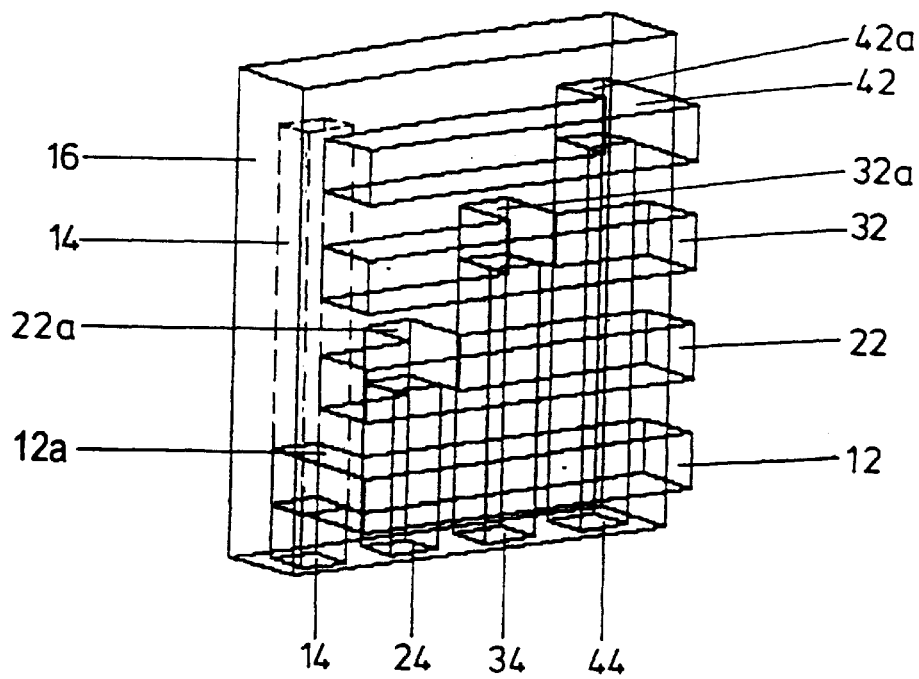
FIG. 3 is a diagrammatic three-dimensional illustration of the configuration of the electrode plates and contact plugs for a plurality of memory cells according to FIG. 1.

FIG. 3 is a diagrammatic three-dimensional illustration of the configuration of contact plugs 14, 24, 34 and 44, the insulating layer 16, and the electrode plates 12, 22, 32 and 42. As shown, the electrode plates 12, 22, 32 and 42 project from the insulating layer 16 in a manner such that they are aligned parallel to one another and are at a distance from one another. The contact plugs 14, 24, 34 and 44 are embedded in the insulating layer 16, just like the "contact prongs" or lug-shaped extensions 12a, 22a, 32a, 42a of the electrode plates 12, 22, 32 and 42.

In the method for the production of a semiconductor memory configuration, first all of the electrode layers and insulating layers are deposited and then holes for the contact plugs are etched over the respective contacts and filled with conductive material. In this case, all of the contact plugs then have the same length. This is illustrated in FIG. 3 only for the contact plug 14', which is depicted by dashed lines. Contact is made with this contact plug 14' exclusively by the contact prong or the lug-shaped extension 12a of the electrode plate 12.

Figure 4:
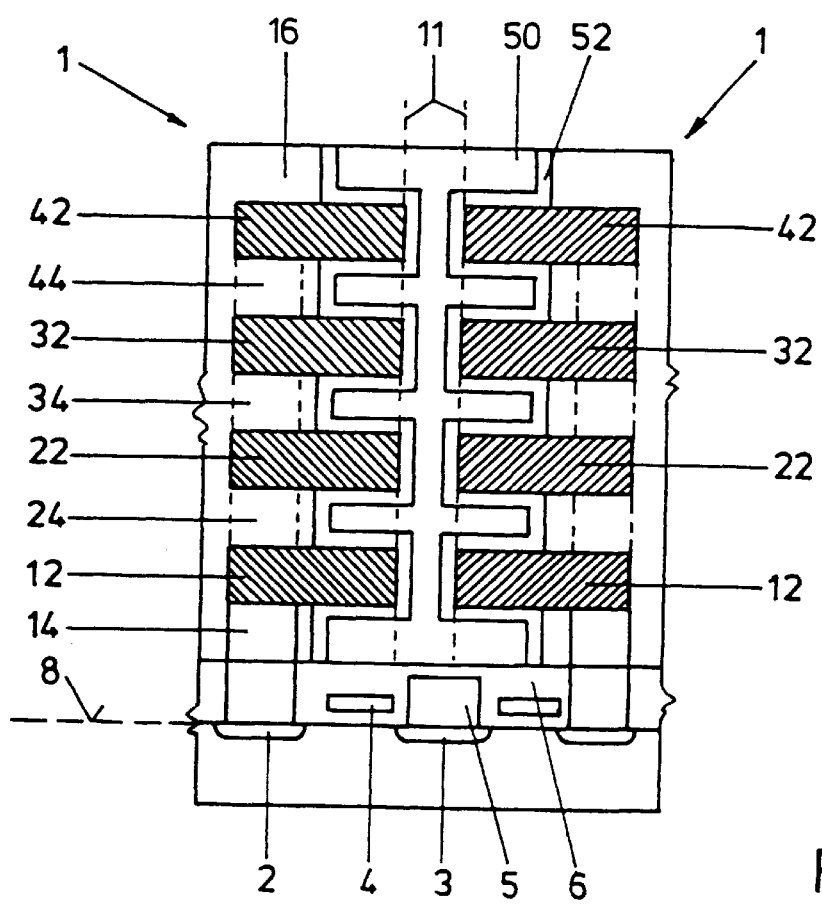
FIG. 4 is a sectional view through a storage capacitor in an integrated semiconductor memory configuration constructed according to the invention.

FIG. 4 is a sectional view through part of the integrated semiconductor memory configuration according to the invention, the section being taken orthogonally with respect to the plate planes of the electrode plates 12, 22, 32 and 42. As shown, the electrode plates 12, 22, 32 and 42 of the groups A and B of memory cells 1 are situated opposite one another in pairs with their ends spaced apart. The free areas of the electrode plates 12, 22, 32 and 42 are uniformly surrounded by a dielectric layer 52 which, seen in section, surrounds the electrode plates 12, 22, 32 and 42 in a meandering manner. The remaining interspace is filled with an electrically conductive layer, that serves as a counter-electrode 50 and thus as a second electrode for the memory cells 1. This counter-electrode 50 is connected for example to the reference-earth potential of the integrated semiconductor memory configuration.

In the view shown in FIG. 4, the contact plugs 14, 24, 34 and 44 are configured one behind the other. Only the shortest contact plug 14 can be seen in this section. This contact plug 14 makes contact with the source region 2 of a selection transistor, as do the other contact plugs 24, 34 and 44. A drain region 3 is situated next to the source region 2 and is in electrical contact with a bit line 5. A gate region (not illustrated) and a word line 4, which are necessary for an integrated memory cell, are situated between the drain region 3 and the source region 2.

The structure of the integrated storage capacitor in accordance with FIG. 4 can be produced by the following method steps. A plurality of layers of electrode material, for example metal or a heavily doped semiconductor material, such as silicon or gallium arsenide, and an insulating material are deposited above the last wiring plane of an integrated semiconductor memory configuration. The individual layers are preferably spaced equidistantly from one another. In addition, holes for the electrical connections are etched over the respective contacts 7 and subsequently filled with electrically conductive material in order to form the contact plugs 14, 24, 34 and 44. A vertical trench 11 (See the dashed trench line shown in FIG. 4) is subsequently etched through all the electrode plates 12, 22, 32 and 42. Isotropic etching of the insulating material 16 ensures that the electrode material of the electrode plates 12, 22, 32 and 42 project into the trench 11 in the form of thin plates. A dielectric is subsequently deposited conformally on the electrode plates 12, 22, 32 and 42 in order to form the dielectric layer 52. A CVD process, for example, is suitable for this purpose. In a further step, the trench is filled with conductive material in order to form the counter-electrode 50.

A high-$\epsilon$ material or a ferroelectric material can be used as the dielectric layer 52. The electrode plates 12, 22, 32, and 42, at least on their sides facing the dielectric 52, must have a noble metal, for example Pt, Ru, Ir, Pd, or oxides such as, for example $IrO_2$, $RuO_2$, LaSrCoOx or the like, or must consist completely of these materials. To form the counter-electrode 50, it is appropriate to first deposit one of the abovementioned materials conformally as a thin layer over the dielectric layer 52 and then to fill the remaining trench 11 with a further, electrically conductive material, for example polysilicon.

We claim:

1. A method for producing an integrated semiconductor memory configuration having storage capacitors, which comprises:

providing a semiconductor body having a main surface with contacts and a memory configuration with a plurality of memory cells, each one of the memory cells having a selection transistor electrically connected to a respective one of the contacts;

depositing a plurality of alternating layers of an insulating material and an electrode plate onto the semiconductor body, the alternating layers disposed one above the other;

providing each one of the electrode plates with a lug projecting in a direction of a respective one of the contacts;

etching holes extending through the plurality of alternating layers of an insulating material and an electrode plate;

etching a plurality of holes through the plurality of alternating layers down to the main surface of the semiconductor body, each respective one of the holes being etched over a respective one of the contacts;

forming a plurality of contact plugs by filling the plurality of holes with conductive material, each contact plug being formed to electrically connect the lug of a respective electrode plate to a respective one of the contacts, and each of the contact plugs being formed with an upper end;

depositing an insulating layer on the upper ends of the plurality of contact plugs;

etching a trench extending through the plurality of alternating layers and being substantially perpendicular to the main surface of the semiconductor body;

isotropically etching away part of the insulating material of the plurality of alternating layers while leaving the plurality of contact plugs surrounded by the insulating material and allowing the electrode plates to project into the trench;

conformally depositing a dielectric layer on the electrode plates; and filling the trench with at least one electrically conductive material to form a second electrode.

2. The method according to claim 1, which further comprises:

providing a material selected from the group consisting of noble metals and oxides on sides of each electrode plate that face the dielectric layer; and providing a material selected from the group consisting of a high-$\epsilon$ material and a ferroelectric material as the dielectric layer.

3. The method according to claim 2, which further comprises:

before the trench filling step, conformally depositing a thin layer of a material selected from the group consisting of noble metals and oxides over the dielectric layer.

* * * * *